(12) United States Patent
Lim

(10) Patent No.: US 6,734,508 B2
(45) Date of Patent: May 11, 2004

(54) MASK ROM, AND FABRICATION METHOD THEREOF

(75) Inventor: Min Gyu Lim, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/039,364

(22) Filed: Nov. 7, 2001

(65) Prior Publication Data

US 2003/0038310 A1 Feb. 27, 2003

(30) Foreign Application Priority Data

Aug. 27, 2001 (KR) .......................... 2001-51826

(51) Int. Cl.7 ............................................. H01L 29/76
(52) U.S. Cl. ..................................................... 257/390
(58) Field of Search ................................ 257/390, 341, 257/314, 315, 316

(56) References Cited

U.S. PATENT DOCUMENTS

| | | | |
|---|---|---|---|
| 6,034,403 A | 3/2000 | Wu | |
| 6,087,699 A | * 7/2000 | Wann et al. | |
| 6,414,346 B1 | * 7/2002 | Kanamori | |

* cited by examiner

Primary Examiner—Nathan J. Flynn
Assistant Examiner—Kevin Quinto
(74) Attorney, Agent, or Firm—Timothy J. Keefer; Seyfarth Shaw LLP

(57) ABSTRACT

The present invention discloses a mask ROM which has excellent compatibility with a logic process and improves integration of a memory cell, and a fabrication method thereof. The mask ROM includes: a substrate where a memory cell array region and a segment select region are defined; first and second trenches respectively formed at the outer portion of the memory cell array region and at the outer portion of a buried layer formation region of the segment select region; an element isolating film and an isolating pattern respectively filling up the first and second trenches; a plurality of buried layers aligned on the substrate in a first direction by a predetermined interval, and surrounded by the isolating pattern; and a plurality of gates aligned in a second direction to cross the buried layers in an orthogonal direction.

3 Claims, 11 Drawing Sheets

MASK ROM, AND FABRICATION METHOD THEREOF

CROSS REFERENCE TO RELATED APPLICATION

This application claims the priority of Korean patent application Serial No. 2001-51826 filed on Aug. 27, 2001.

BACKGROUND OF THE INVENTION

1. Field of the Invention

The present invention relates to a mask ROM and a fabrication method thereof, and in particular to a mask ROM which has excellent compatibility with a logic process and improves integration of a memory cell, and a fabrication method thereof.

2. Description of the Background Art

A mask ROM is a non-volatile device for discriminating data and recording necessary information according to a mask process in an element isolation process, a metal process or an ion implant process for a channel region of a memory cell.

FIG. 1 is a layout diagram illustrating a memory cell of a conventional flat cell type mask ROM.

The flat cell type mask ROM has been widely used in a fabrication method using a logic process.

Referring to FIG. 1, the flat cell type mask ROM includes: a substrate 100 where a memory cell array region I and a segment select region II are defined; a trench (not shown) formed at the outer portion of the memory cell array region I of the substrate 100; an element isolating film (not shown) filling up the trench; a plurality of buried layers 110 aligned on the resultant structure in a first direction by a predetermined interval; and a plurality of gates 114 aligned in a second direction to cross the buried layers 110 in an orthogonal direction.

In the fabrication process of the flat cell type mask ROM, an isolation process is performed at the outer portion of the memory cell array region I to surround the whole memory cell array region I, instead of performing a LOCOS or STI process for isolating memory cells. A source/drain junction of the memory cell is the buried layer 110 formed before the gate process. It is thus unnecessary to isolate the junctions.

A contact 122 of the buried layer junction does not exist in the memory cell array region I but in the segment select region II. In addition, a width of the gate 114 is a channel width of the memory cell.

As described above, the isolating film and the contact are not formed in the memory cell, and thus a size of the memory cell is about $4F^2$ ('F' implies a minimum line width of photolithography), thereby improving integration, simplifying the whole process and cutting down production costs.

When a logic process of a design rule below 0.35 μm is applied to the fabrication process of the flat cell type mask ROM, 1) the isolation process is performed by LOCOS, 2) N type impurity-doped polysilicon, Ti-Salicide or W-Polycide is used as the gate formation material, and 3) Ti-Salicide identical to the gate formation material is employed as the source/drain junction.

In addition, when the flat cell type mask ROM is fabricated according to a logic process of a design rule below 0.25 μm, 1) the isolation process is performed to surround the whole memory cell array region by a trench STI, 2) Ti-Salicide or Co-Salicide is used as the gate formation material, and 3) Ti-Salicide or Co-Salicide identical to the gate formation material is employed as the source/drain junction.

Accordingly, the flat cell type mask ROM having compatibility with the logic process of a design rule below 0.35 μm has been commercially used. There are therefore increasing demands for a flat cell process having compatibility with the logic process below 0.25 μm.

FIG. 2 is a flowchart showing a conventional flat cell type mask ROM process.

As illustrated in FIG. 2, the conventional method for fabricating the mask ROM includes: an isolation process for forming an element isolating film at the outer portion of a memory cell array region; a well formation process; a buried layer formation process; a process for forming a gate insulating film and gates in the memory cell array region and its peripheral region; a cell isolation ion implant process for implanting ions to the memory cell array region; a process for forming a source/drain in the gates of the peripheral region; a coding process; a process for forming a contact in a buried layer of a segment select region; and a bit line formation process.

FIGS. 3a through 3c are cross-sectional diagrams, taken along lines AB, BC and CD of FIG. 1. In FIGS. 3a to 3c, 'a' denotes an active region of the memory cell array region, and 'b' denotes a peripheral region which is the outer portion of the active region.

The conventional method for fabricating the mask ROM will now be described in detail with reference to FIGS. 3a to 3c.

As depicted in FIG. 3a, provided is a substrate 100 where a memory cell array region I and a segment select region II are defined.

A trench 103 is formed by etching the outer portion of the active region (a) of the memory cell array region I of the substrate 100. Thereafter, an insulating film such as an oxide silicon film is deposited over the resultant structure, and etched according to an etch back process or a chemical mechanical polishing process, to form an element isolating film 104 filling up the trench 103.

A well 102 is formed on the substrate 100 having the element isolating film 104 according to an impurity implant process. Here, the element isolating film formation process may be performed after the well formation process, as depicted in FIG. 3B.

Thereafter, a photolithography process and an impurity implant process are sequentially carried out in the memory cell array region I and the segment select region II of the substrate 100 having the well 102, thereby forming buried layers 110, 111 aligned in one direction.

A gate insulating layer 112 is positioned on the substrate 100, to form gates 114 aligned in an orthogonal direction to the buried layers 110, 111.

Although not illustrated, a cell isolation ion implant process is performed in the active region (a) of the memory cell array region I, a source/drain 130 is formed in the peripheral region (b), and a coding process is performed thereon.

As shown in FIG. 3c, a protective film 120 is deposited on the substrate 100, and a contact 122 serving as a passage to a bit line (not shown) to be formed according to a succeeding process is formed on the buried layer 111 of the segment select region II.

Then, the bit line electrically connected to the buried layer 111 of the segment select region II through the contact 122 is formed, and thus fabrication of the mask ROM is finished.

When the mask ROM is fabricated according to the logic process of a design rule below 0.25 μm, the element isolating film is formed according to the shallow trench isolation and the chemical mechanical polishing process.

In general, one segment of the memory cell consists of 32 word lines and 1024 bit lines. When a size of the segment is decreased, an area of the memory cell having the same integration is increased. Considering that the gate is designed under the minimum design rule, a height of the 32 word lines is approximately 64F. When it is presumed that a height of the segment select end is about 12F, a height of the segment is 76F, and a length of the 1024 bit lines is about 2048F. That is, a size of the segment is represented by '2048F×76F'. In the case of the design rule below 0.25 μm, the size of the segment is represented by '512F×19 μm'.

The memory cell is an aggregate of the segments. For example, 128 segments are required to compose a 4M bit memory cell array. Therefore, a size of the 4M bit memory cell is approximately '512F×2432 μm', which is a size of the active region composing a memory cell block.

However, in the conventional method for fabricating the mask ROM, a polishing speed is not uniform in the wide active region of the memory cell array region. As a result, polishing uniformity is reduced in a memory cell larger than '200 μm×200 μm'.

In addition, the buried layer is patterned in a minimum size allowable in the photolithography. It is thus difficult to pattern the buried layer in the boundary portion between the segment select region and the memory cell array region.

SUMMARY OF THE INVENTION

Accordingly, it is an object of the present invention to provide a method for fabricating a mask ROM which can improve polishing uniformity in a polishing process in the element isolating film formation, and which can easily pattern a buried layer in a boundary portion between a segment select region and a memory cell array region.

In order to achieve the above-described object of the present invention, there is provided a mask ROM including: a substrate where a memory cell array region and a segment select region are defined; first and second trenches respectively formed at the outer portion of the memory cell array region and at the outer portion of a buried layer formation region of the segment select region; an element isolating film and an isolating pattern respectively filling up the first and second trenches; a plurality of buried layers aligned on the substrate in a first direction by a predetermined interval, and surrounded by the isolating pattern; and a plurality of gates aligned in a second direction to cross the buried layers in an orthogonal direction.

There is also provided a method for fabricating a mask ROM including the steps of: providing a substrate where a memory cell array region and a segment select region are defined; forming an element isolating film and an isolating pattern at the outer portion of the memory cell array region and at the outer portion of a buried layer formation region of the segment select region; forming a plurality of buried layers aligned over the resultant structure in a first direction by a predetermined interval, and surrounded by the isolating pattern; and forming a plurality of gates aligned in a second direction to cross the buried layers in an orthogonal direction.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A mask ROM and a fabrication method thereof in accordance with a preferred embodiment of the present invention will now be described in detail with reference to the accompanying drawings.

Figure 1:
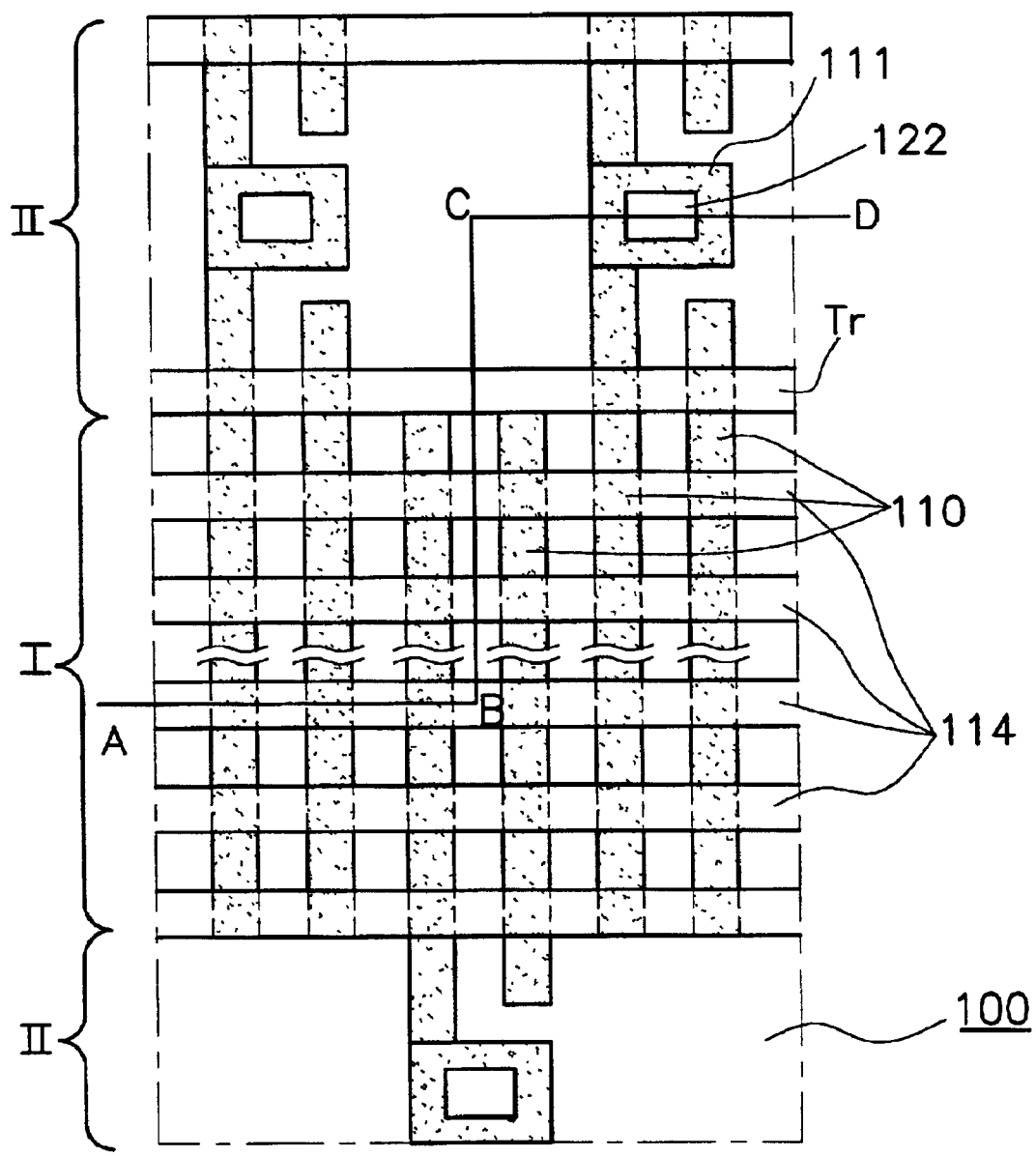
FIG. 1 is a layout diagram illustrating a memory cell of a conventional flat cell type mask ROM.
Figure 2:
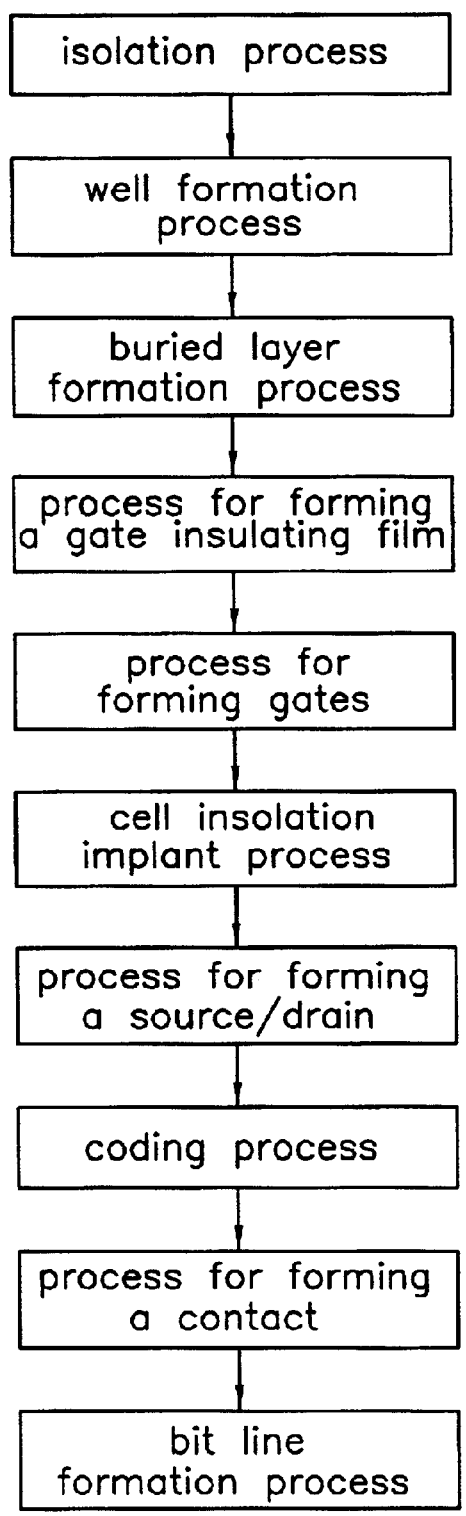
FIG. 2 is a flowchart showing a conventional flat cell type mask ROM process.
Figure 3A:
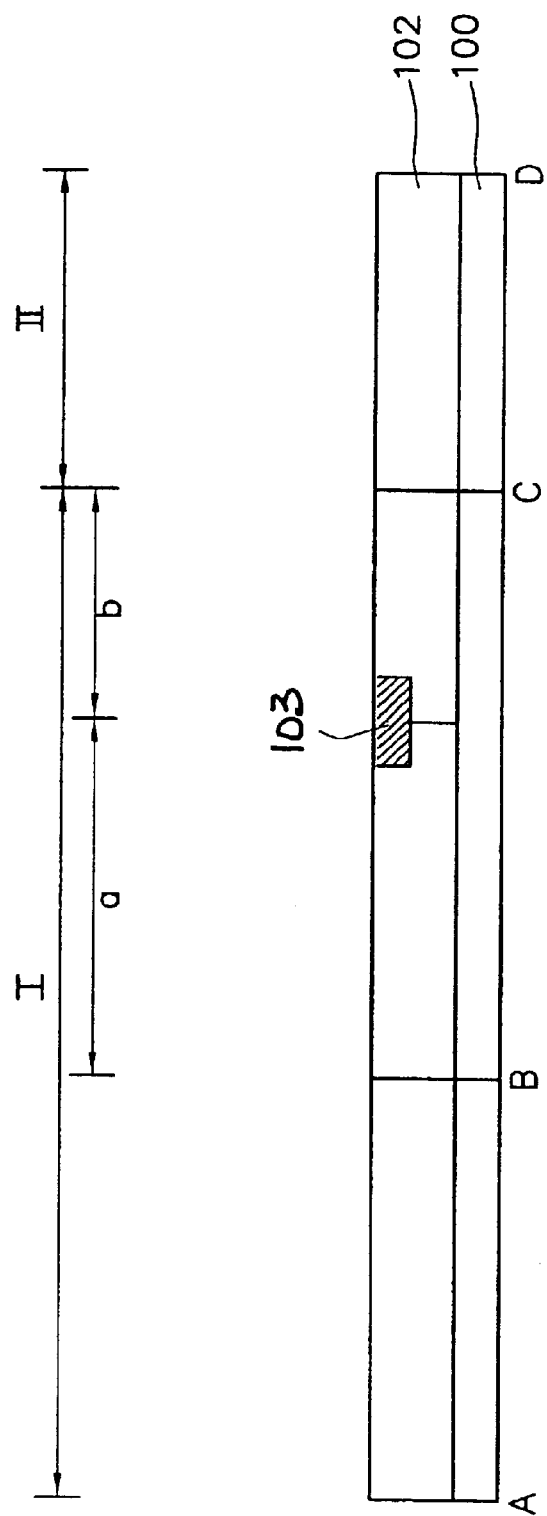
FIGS. 3a through 3c are cross-sectional diagrams, taken along lines AB, BC and CD of FIG. 1.
Figure 3B:
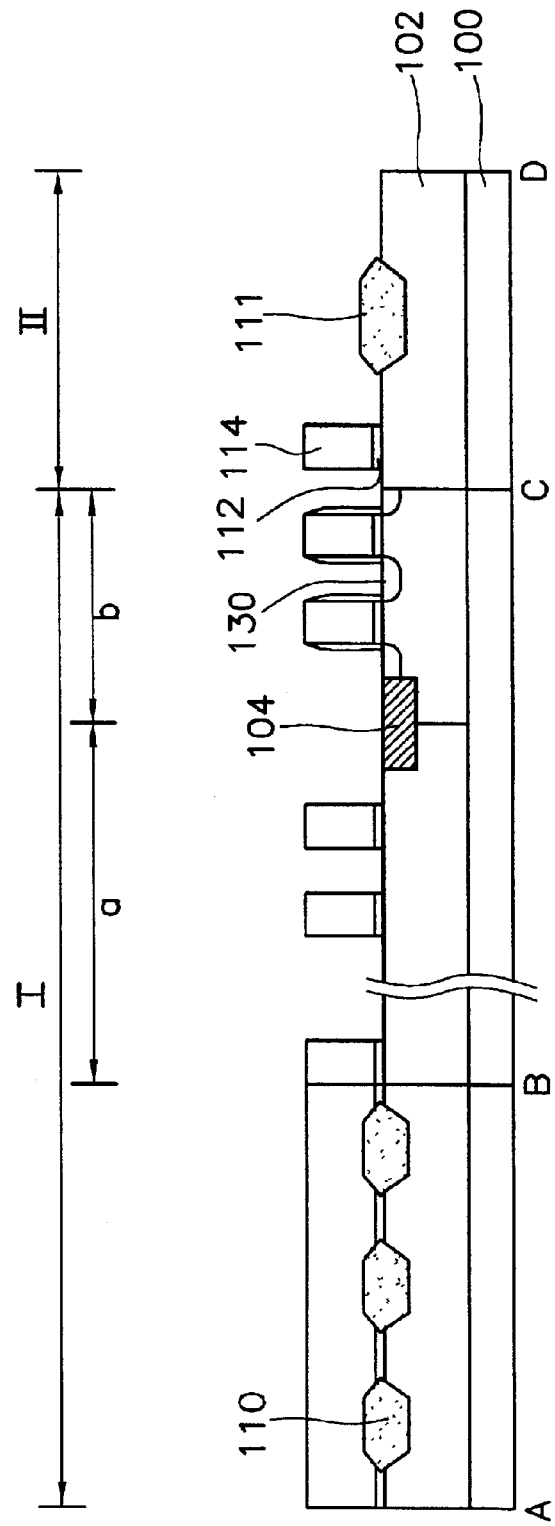
Figure 3C:
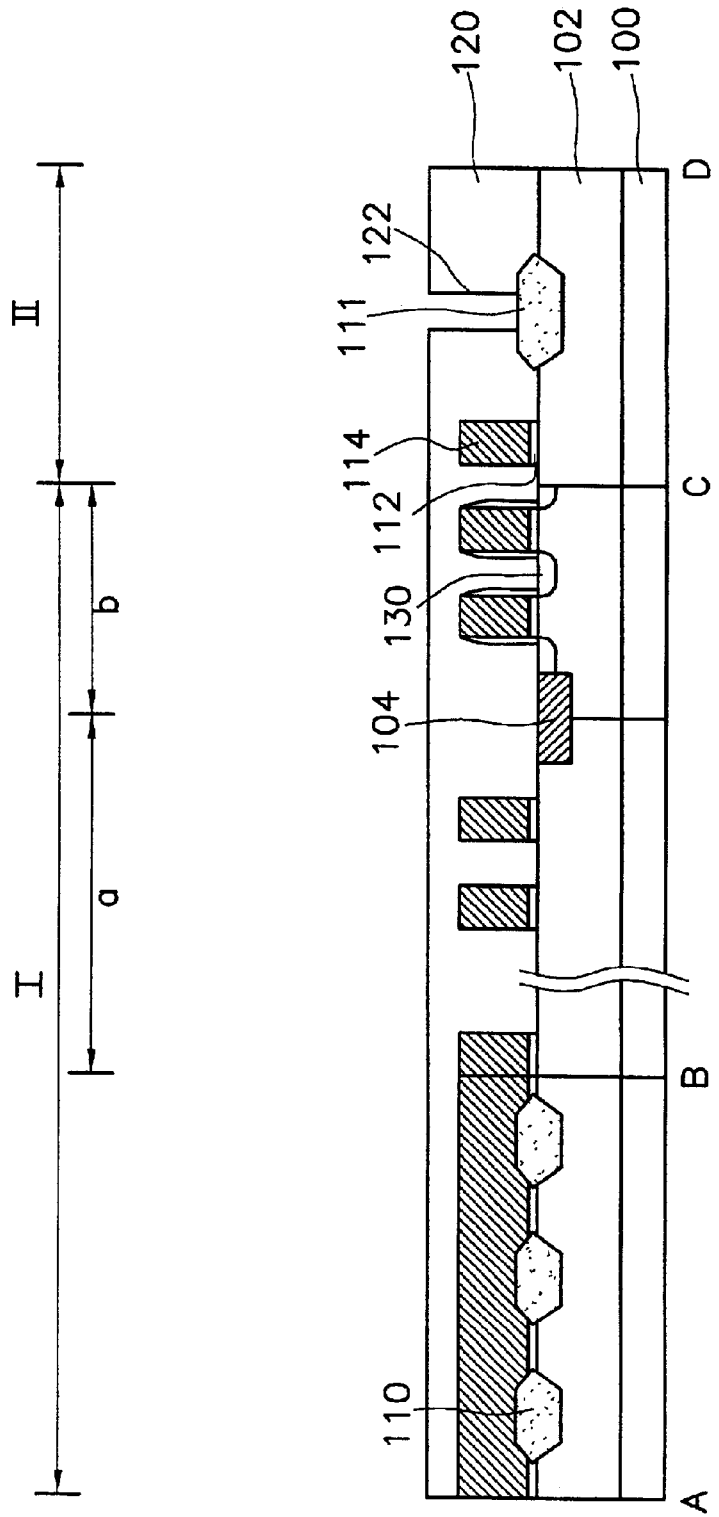
Figure 4:
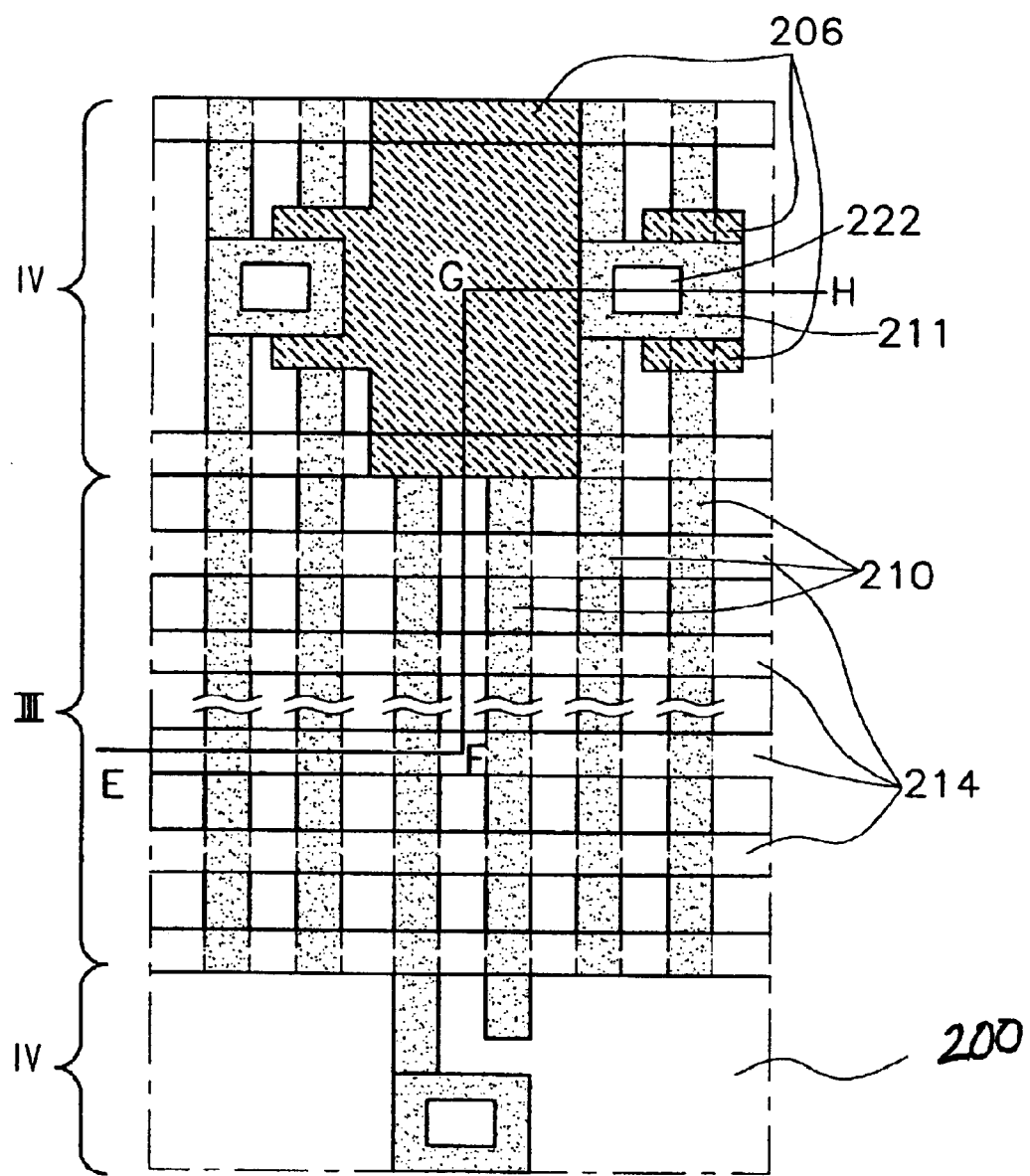
FIG. 4 is a layout diagram illustrating a memory cell of a flat cell type mask ROM in accordance with the present invention.
Figure 5:
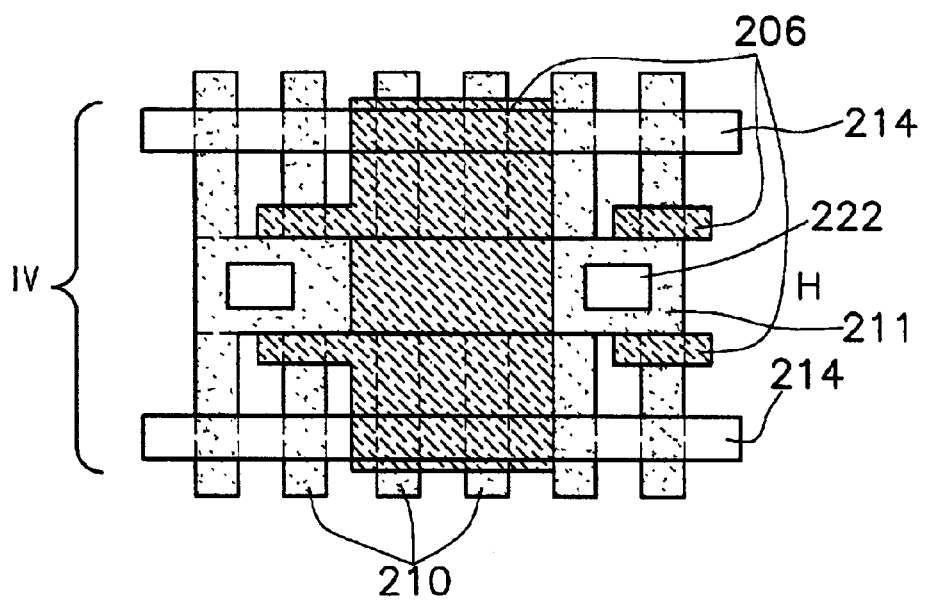
FIG. 5 is a layout diagram illustrating a segment select region in accordance with the present invention.

FIG. 4 is a layout diagram illustrating a memory cell of a flat cell type mask ROM in accordance with the present invention, and FIG. 5 is a layout diagram illustrating a segment select region in accordance with the present invention.

Figure 8A:
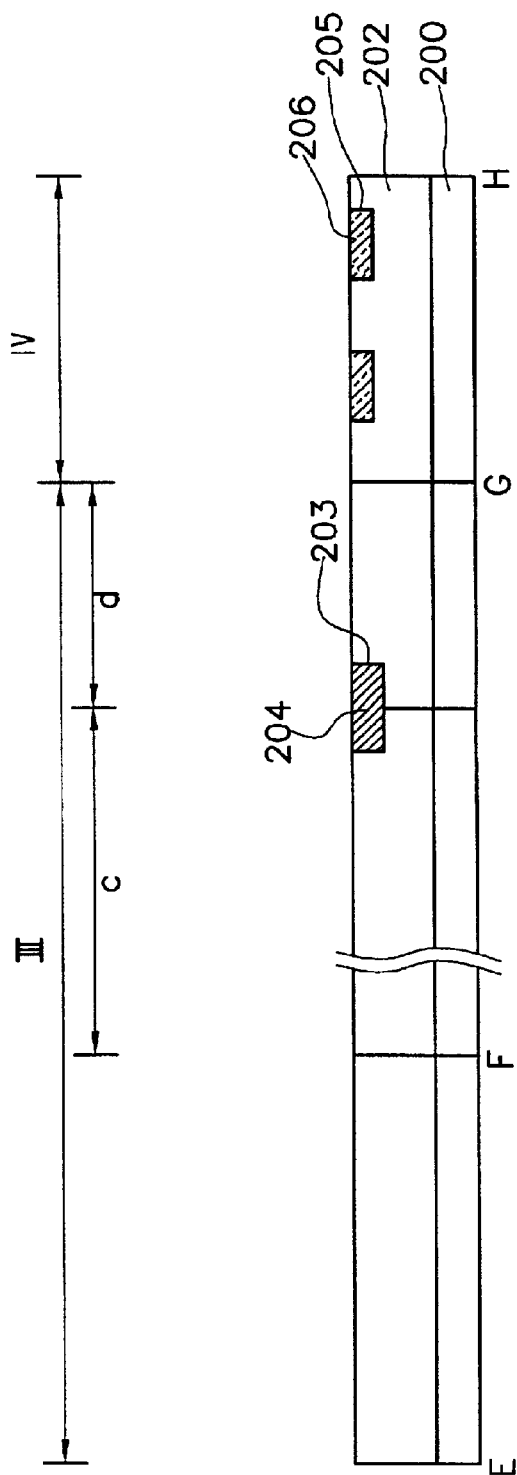
FIGS. 8a through 8c are cross-sectional diagrams, taken along lines EF, FG and GH of FIG. 4.

The flat cell type mask ROM includes: a substrate 200 where a memory cell array region and a segment select region are defined; first and second trenches 203, 205, as depicted in FIG. 8A, respectively formed at the outer portion of the memory cell array region and at the outer portion of a buried layer formation region of the segment select region; an first isolation film 204 and an isolating pattern 206 respectively filling up the first and second trenches 203, 205; a plurality of buried layers 210 aligned on the substrate 200 in a first direction by a predetermined interval, and surrounded by the second isolation film 206; and a plurality of gate insulating layers 212 and gates 214 aligned in a second direction to cross the buried layers 210 in an orthogonal direction.

Figure 8B:
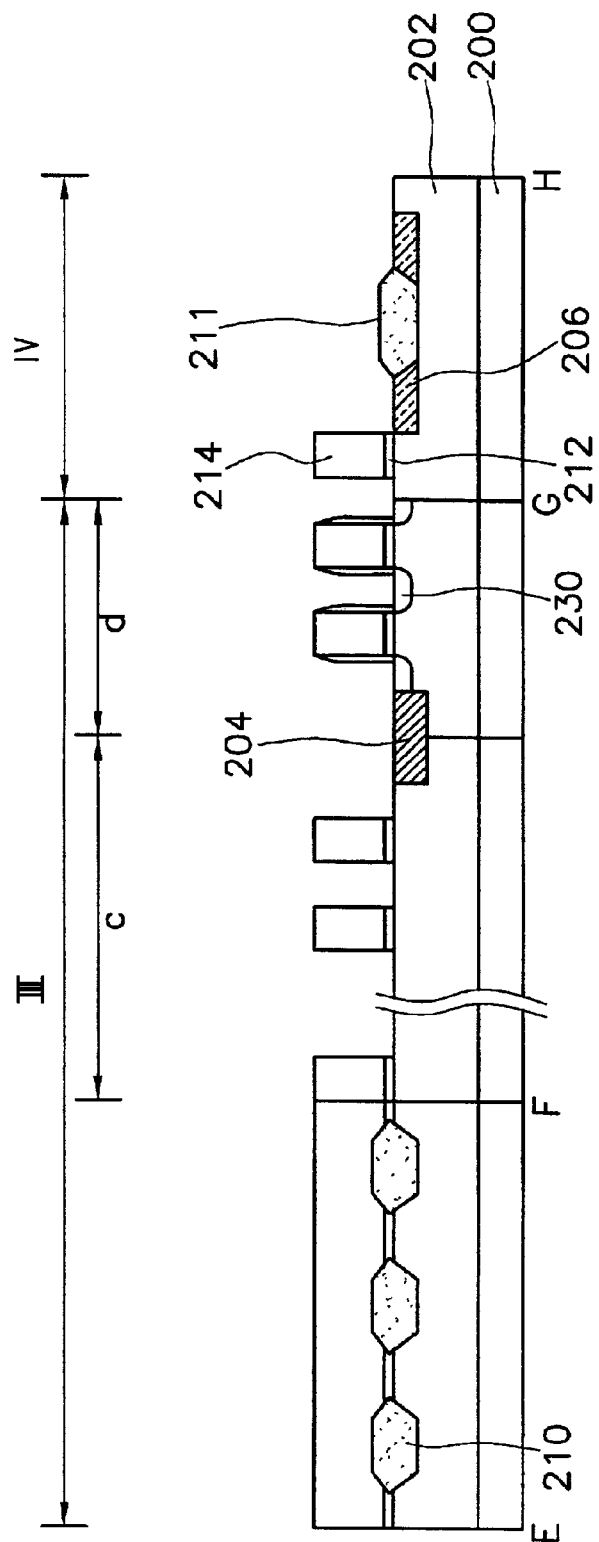
Figure 8C:
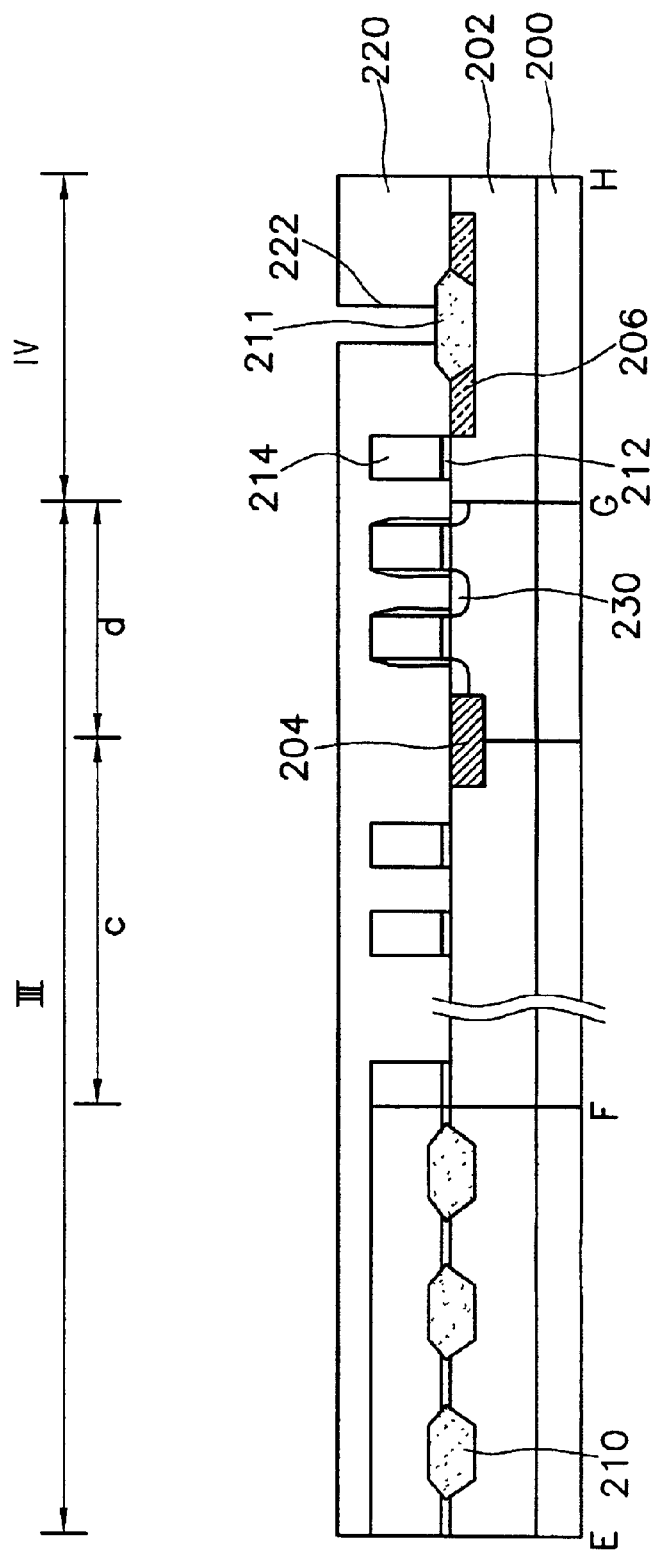

FIGS. 8a through 8c are cross-sectional diagrams, taken along lines EF, FG and GH of FIG. 4. In FIGS. 8a to 8c, 'c' denotes an active region of the memory cell array region, and 'd' denotes a peripheral region which is an outer portion of the active region.

Referring to FIG. 8a, provided is the substrate 200 where the memory cell array region III and the segment select region IV are defined.

The first and second trenches 203, 205 are formed by etching the outer portion of the active region (c) of the memory cell array region III, and the outer portion of a buried layer formation region of the segment select region IV. Here, the first and second trenches 203, 205 are etched at a depth of 3000 to 4000 Å from the surface of the substrate 200.

Thereafter, an insulating film such as an oxide silicon film is deposited over the resultant structure having the first and second trenches 203, 205, and etched according to an etch back process or a chemical mechanical polishing process, to form the first isolation film 204 and the isolating pattern filling up the first and second trenches 203, 205.

At this time, the first isolation film 204 is formed at the outer portion of the active region (c) of the memory cell array region III, for isolating the active region (c) from the peripheral region (d). The second isolation film 206 is formed in the segment select region IV, for isolating the succeeding segment select region IV from the buried layer of the memory cell array region III.

A well 202 is formed on the substrate 200 having the first isolation film 204 and the second isolation film 206 according to an impurity implant process. Here, the element isolating film formation process and the well formation process may be performed in an inverse order.

As illustrated in FIG. 8b, a photolithography process and an impurity implant process are sequentially carried out on the substrate 200 having the well 202, thereby forming buried layers 210, 211 aligned in one direction.

Although not illustrated, a pad oxide film and a nitride film are sequentially deposited on the substrate 200 having the well 202. A photoresist film covering the buried layer formation region is formed by coating a photoresist film on the nitride film, and exposing and developing the photoresist film. The substrate 200 is exposed by removing the nitride film and the pad oxide film by using the photoresist film pattern, and impurities are ion-implanted thereto, thereby forming the buried layers 210, 211.

Reference numeral 210 denote the buried layer formed in the memory cell array region III, and 211 denotes the buried layer formed in the second isolation film 206 of the segment select region IV.

Figure 6:
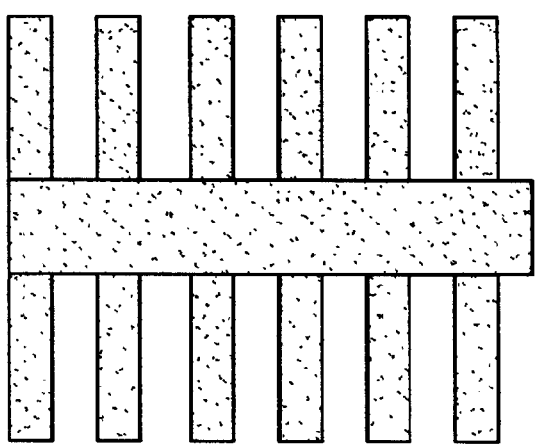
FIG. 6 is a plan diagram illustrating a mask pattern for forming buried layers in the segment select region in accordance with the present invention.
Figure 7:
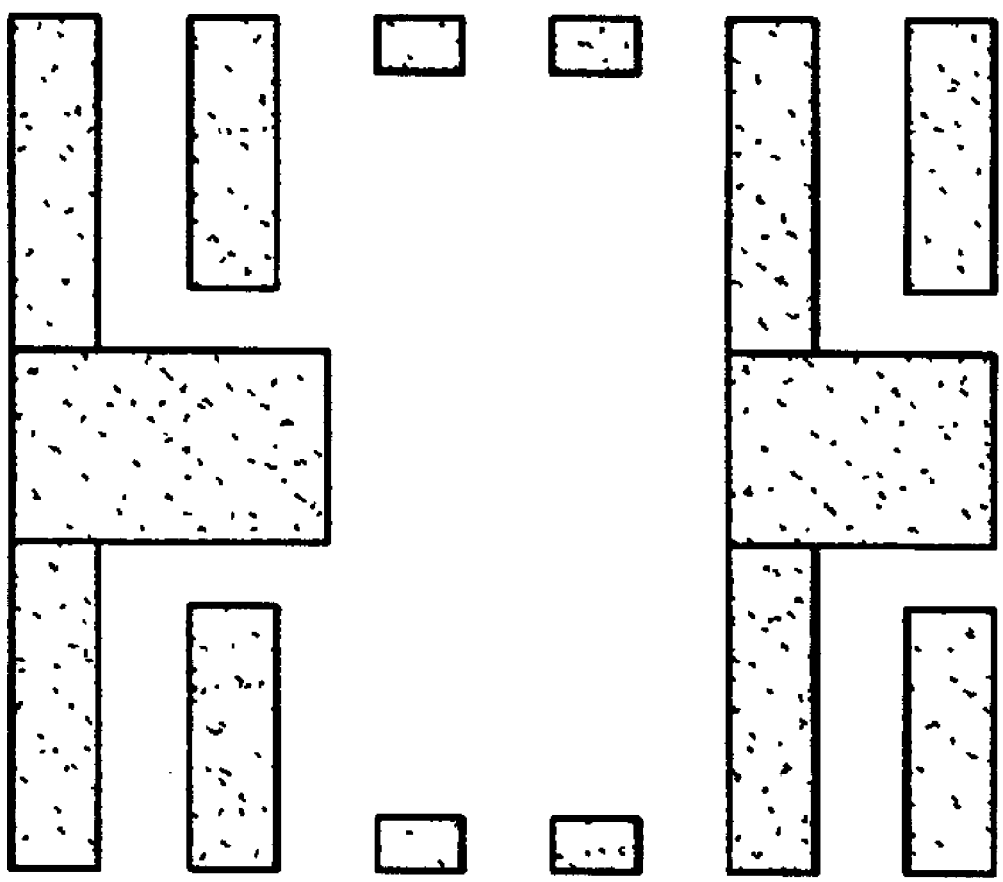
FIG. 7 is a plan diagram illustrating the buried layers in the segment select region in accordance with the present invention.

FIG. 6 is a plan diagram illustrating a mask pattern for forming the buried layers in the segment select region in accordance with the present invention, and FIG. 7 is a plan diagram illustrating the buried layers in the segment select region in accordance with the present invention.

The buried layers 210, 211 are patterned by using the mask pattern of FIG. 6. However, as depicted in FIG. 7, ions are implanted to the mask pattern region except the isolating pattern region.

A gate insulating layer 212 is positioned on the substrate 200, to form gates 214 aligned in an orthogonal direction to the buried layers 210, 211.

A cell isolation ion implant process is performed in the active region (c) of the memory cell array region III, a source/drain 230 is formed in the peripheral region (d), and a coding process is performed thereon.

Referring to FIG. 8c, a protective film 220 is deposited on the substrate 200 and etched to form a contact 111 for exposing the buried layer 211 of the segment select region IV. The contact 222 serves as a passage to a bit line to be formed according to a succeeding process.

Then, a bit line (not shown) electrically connected to the buried layer 211 of the segment select region IV through the contact 211 is formed, and thus fabrication of the mask ROM is finished.

As discussed earlier, in accordance with the present invention, the isolating pattern is added in every segment which is the minimum unit of the flat cell memory array, and thus a transistor of the segment select region and a memory cell transistor of the memory cell array region are not influenced by the buried layers, thereby maintaining a homogeneous device property. In addition, the flat cell process is performed under the logic process conditions of a design rule below 0.25 µm.

Moreover, a size of the active region is reduced to the memory cell array region of the segment, which results in improved polishing uniformity of the chemical mechanical polishing process.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A mask ROM comprising:

a substrate where a memory cell array region and a segment select region are defined;

first and second trenches respectively formed at the outer portion of the memory cell array region and at the outer portion of a buried layer formation region of the segment select region;

a first isolation film and an isolating pattern respectively filling up the first and second trenches, wherein the second isolating film isolates the segment select region from the memory cell array region;

a plurality of buried layers aligned on the substrate in a first direction by a predetermined interval, and surrounded by the second isolation film; and a plurality of gates aligned in a second direction to cross the buried layers in an orthogonal direction.

2. The mask ROM according to claim 1, wherein the first and second trenches have a depth of 3000 to 4000 Å from the surface of the substrate.

3. The mask ROM according to claim 1, further comprising:

a protective film for covering the whole substrate including the gates;

a contact formed in the protective film, for partially exposing the buried layer of the segment select region; and a bit line for covering the contact.

* * * * *